(12) United States Patent
Woo et al.

(10) Patent No.: US 9,391,053 B2
(45) Date of Patent: Jul. 12, 2016

(54) NON-SHRINK VARISTOR SUBSTRATE AND PRODUCTION METHOD FOR SAME

(71) Applicant: AMOSENSE CO., LTD., Chungcheongnam-do (KR)

(72) Inventors: Kyung-Whan Woo, Gyeonggi-do (KR); Sung-Baek Dan, Gyeonggi-do (KR)

(73) Assignee: AMOSENSE CO., LTD., Cheonan-si, Chungcheongnam-do (KR)

( * ) Notice: Subject to any disclaimer, the term of this patent is extended or adjusted under 35 U.S.C. 154(b) by 0 days.

(21) Appl. No.: 14/424,955

(22) PCT Filed: Aug. 28, 2013

(86) PCT No.: PCT/KR2013/007731
§ 371 (c)(1),
(2) Date: Feb. 27, 2015

(87) PCT Pub. No.: WO2014/035143
PCT Pub. Date: Mar. 6, 2014

(65) Prior Publication Data
US 2015/0214202 A1 Jul. 30, 2015

(30) Foreign Application Priority Data

Aug. 28, 2012 (KR) ........................ 10-2012-0094078
Apr. 10, 2013 (KR) ........................ 10-2013-0039268

(51) Int. Cl.
*H01L 33/48* (2010.01)
*H01C 7/10* (2006.01)
(Continued)

(52) U.S. Cl.
CPC ................ *H01L 25/167* (2013.01); *H01C 7/10* (2013.01); *H01C 7/112* (2013.01); *H01C 7/12* (2013.01); *H01C 7/18* (2013.01); *H01C 17/00* (2013.01); *H01C 17/281* (2013.01); *H01L 23/60* (2013.01); *H01L 33/48* (2013.01); *H01L 33/483* (2013.01);
(Continued)

(58) Field of Classification Search
None
See application file for complete search history.

(56) References Cited

U.S. PATENT DOCUMENTS 7,279,724 B2 * 10/2007 Collins, III ............ H01C 7/112
257/100
2007/0171025 A1 7/2007 Katsumura et al.
(Continued)

FOREIGN PATENT DOCUMENTS

JP 2000-183384 6/2000
JP 2005-294673 10/2005
(Continued)

OTHER PUBLICATIONS

International Search Report mailed Dec. 24, 2013, for International Application No. PCT/KR2013/007731.

*Primary Examiner* — Minh-Loan Tran
(74) *Attorney, Agent, or Firm* — Baker Hostetler LLP

(57) ABSTRACT

Disclosed are a non-shrink varistor substrate and a method of manufacturing the same, wherein the non-shrink varistor substrate includes: a reinforcement layer formed of a ceramic material; a thin bonding layer formed on the surface of the reinforcement layer; a first varistor layer formed on the thin bonding layer and including a plurality of inner electrode layers therein; and an outer electrode layer formed on the first varistor layer and electrically connected to the inner electrode layers by a conductive material loaded in a via hole formed through the first varistor layer, the thin bonding layer and the reinforcement layer, and also wherein bondability and bonding reliability can be enhanced upon heterobonding of the reinforcement layer and the varistor layer.

18 Claims, 6 Drawing Sheets

(51) Int. Cl.
   *H01L 25/16*   (2006.01)
   *H01C 7/18*    (2006.01)
   *H01C 17/28*   (2006.01)
   *H01C 17/00*   (2006.01)
   *H01C 7/12*    (2006.01)
   *H01L 33/62*   (2010.01)
   *H01L 23/60*   (2006.01)
   *H01C 7/112*   (2006.01)

(52) U.S. Cl.
   CPC ............... *H01L 33/62* (2013.01); *H01L 33/486* (2013.01); *H01L 2224/48091* (2013.01); *H01L 2924/0002* (2013.01)

(56) References Cited

U.S. PATENT DOCUMENTS

| | | |
|---|---|---|
| 2007/0297108 A1 | 12/2007 | Collins, III et al. |
| 2008/0224816 A1* | 9/2008 | Inoue .................... H01C 7/102 338/21 |
| 2009/0096569 A1 | 4/2009 | Choi et al. |
| 2009/0189732 A1* | 7/2009 | Sato ....................... H01C 1/084 338/21 |
| 2009/0243768 A1* | 10/2009 | Sato ....................... H01C 7/102 335/7 |
| 2010/0117782 A1* | 5/2010 | Sato ....................... H01C 7/1006 338/21 |
| 2013/0335189 A1* | 12/2013 | Abe ....................... H01C 1/014 338/21 |

FOREIGN PATENT DOCUMENTS

| | | |
|---|---|---|
| JP | 2009-252930 | 10/2009 |
| KR | 100693119 B1 | 3/2007 |
| KR | 1009810790000 | 9/2010 |
| KR | 101137405 B1 | 4/2012 |
| KR | 10-2012-0113130 A | 10/2012 |
| KR | 10-2013-0007693 A | 1/2013 |
| WO | 2009075530 A2 | 6/2009 |

* cited by examiner

NON-SHRINK VARISTOR SUBSTRATE AND PRODUCTION METHOD FOR SAME

CROSS-REFERENCE TO RELATED APPLICATIONS

This application claims priority to International Application No. PCT/KR2013/007731, filed Aug. 28, 2013, which claims priority to KR 10-2012-0094078, filed Aug. 28, 2012 and KR 10-2013-0039268, filed Apr. 10, 2013, the disclosures of which are incorporated herein by reference in their entirety.

TECHNICAL FIELD

The present invention relates to a non-shrink varistor substrate and a method of manufacturing the same. More particularly, the present invention relates to a non-shrink varistor substrate and a method of manufacturing the same, wherein the non-shrink varistor substrate has a low shrinkage rate upon firing, high mechanical strength, and good heat dissipation efficiency.

BACKGROUND ART

A light emitting diode (LED) has advantages such as low power, high efficiency, high luminance, and long lifetime and is thus mainly provided in the form of a package in electronic parts, but is disadvantageously susceptible to static electricity or inverse voltage. In order to utilize an LED in the presence of static electricity or inverse voltage, a Zener diode or a varistor is connected parallel to an LED chip.

However, a process of integrally packaging a Zener diode or a varistor with an LED chip is problematic because of a limited space and an increased number of processes due to additional processing, and an enlarged size and high manufacturing cost due to additional mounting.

Also, by means of a Zener dioder or a varistor disposed to be flush with the LED chip, light produced from the LED chip may be scattered and refracted, making it difficult to efficiently control a luminous view angle. Therefore, a process of embedding a Zener diode in a substrate is being adopted.

A device-incorporated substrate includes inner and outer electrodes, and the inner electrodes are printed between the sheets of the substrate and then sintered. The outer electrodes are connected to the inner electrodes.

However, a substrate disclosed in Korean Patent Application Publication No. 2013-0007693 may cause shrinkage deformation in a firing process depending on the type of material for the substrate. Furthermore, the shrinkage rate of the substrate is not uniform, making it difficult to manufacture a substrate that satisfies a precise dimension standard. Moreover, reducing the shrinkage rate of the substrate may be complicated, undesirably deteriorating productivity. Also, as the substrate itself is not enhanced in mechanical strength, utility of the substrate may decrease.

DISCLOSURE

Technical Problem

An object of the present invention is to provide a non-shrink varistor substrate and a method of manufacturing the same, wherein bondability and bonding reliability may be enhanced upon heterobonding of a reinforcement layer and a varistor layer.

In addition, another object of the present invention is to provide a non-shrink varistor substrate and a method of manufacturing the same, wherein a thin bonding layer is formed on the surface of the reinforcement layer, so that a molded body may be bonded in a non-shrink firing mode to thereby ensure dimensional precision.

In addition, still another object of the present invention is to provide a non-shrink varistor substrate and a method of manufacturing the same, wherein a thin bonding layer is formed on the surface of the reinforcement layer to thereby further enhance mechanical strength of the varistor substrate.

Technical Solution

In order to accomplish the above objects, the present invention provides a non-shrink varistor substrate, comprising: a reinforcement layer formed of a ceramic material; a thin bonding layer formed on the surface of the reinforcement layer; a first varistor layer formed on the thin bonding layer and including a plurality of inner electrode layers; and an outer electrode layer formed on the first varistor layer and electrically connected to the inner electrode layers by a conductive material loaded in a via hole formed through the first varistor layer, the thin bonding layer, and the reinforcement layer.

Also, the non-shrink varistor substrate may further comprise a first bonding layer formed between the thin bonding layer and the first varistor layer.

As such, the outer electrode layer may be formed on the first varistor layer and may be electrically connected to the inner electrode layers by a conductive material loaded in a via hole formed through the first varistor layer, the first bonding layer, the thin bonding layer, and the reinforcement layer.

Also, the non-shrink varistor substrate may further comprise a second varistor layer formed under the thin bonding layer and including a plurality of inner electrode layers therein.

Also, the non-shrink varistor substrate may further comprise a second bonding layer formed between the thin bonding layer and the second varistor layer.

As such, outer electrode layers may be formed on the first varistor layer and under the second varistor layer, and may be electrically connected to the inner electrode layers by a conductive material loaded in a via hole formed through the first varistor layer, the thin bonding layer, the reinforcement layer, and the second varistor layer.

Also, the thin bonding layer may be formed into an oxide layer by a pre-firing process.

The first bonding layer may have a ZnO-based composition comprising, based on 100 parts by weight thereof, 75~95 parts by weight of ZnO, 0~5 parts by weight of $Pr_2O_5$, 5~15 parts by weight of $Bi_2O_3$, and 0~5 parts by weight of $Sb_2O_3$.

The second bonding layer may have a ZnO-based composition comprising, based on 100 parts by weight thereof, 75~95 parts by weight of ZnO, 0~5 parts by weight of $Pr_2O_5$, 5~15 parts by weight of $Bi_2O_3$, and 0~5 parts by weight of $Sb_2O_3$.

The thin bonding layer may comprise at least one of $SiO_2$, CuO, $TiO_2$ and $Cr_2O_3$.

In addition, the present invention provides a method of manufacturing a non-shrink varistor substrate, comprising: forming a reinforcement layer using a ceramic material; forming a thin bonding layer on the surface of the reinforcement layer; forming a first varistor layer having a plurality of inner electrode layers on the thin bonding layer; firing a varistor molded body comprising the reinforcement layer, the thin bonding layer, and the first varistor layer; and forming an outer electrode layer electrically connected to the inner electrode layers by a conductive material loaded in a via hole formed through the first varistor layer, the thin bonding layer, and the reinforcement layer.

Also, the method may further comprise forming a first bonding layer on the thin bonding layer, after forming the thin bonding layer, and firing the varistor molded body may be performed under the condition that the first bonding layer is provided.

Also, the method may further comprise forming a second varistor layer having a plurality of inner electrode layers under the thin bonding layer, after forming the first varistor layer, and firing the varistor molded body may be performed under the condition that the second varistor layer is provided.

Also, the method may further comprise forming a second bonding layer under the thin bonding layer, before forming the second varistor layer, and firing the varistor molded body may be performed under the condition that the second bonding layer is provided.

Advantageous Effects

According to the present invention, in a non-shrink varistor substrate and a method of manufacturing the same, a thin bonding layer is formed on the surface of a reinforcement layer upon heterobonding of a reinforcement layer and a varistor layer, and thereby bondability and bonding reliability can be enhanced.

Also in the non-shrink varistor substrate and the method of manufacturing the same, as the thin bonding layer is formed on the surface of the reinforcement layer, a molded body can be bonded in a non-shrink firing mode, thereby ensuring dimensional precision.

Also in the non-shrink varistor substrate and the method of manufacturing the same, the formation of the thin bonding layer on the surface of the reinforcement layer is effective at enhancing mechanical strength of a varistor substrate.

MODE FOR INVENTION

Hereinafter, a detailed description will be given of the present invention with reference to the appended drawings. In the following description, it is to be noted that, a redundant description, known techniques that may make the gist of the present invention unclear, and a detailed description of constructions will be omitted.

Figure 1:
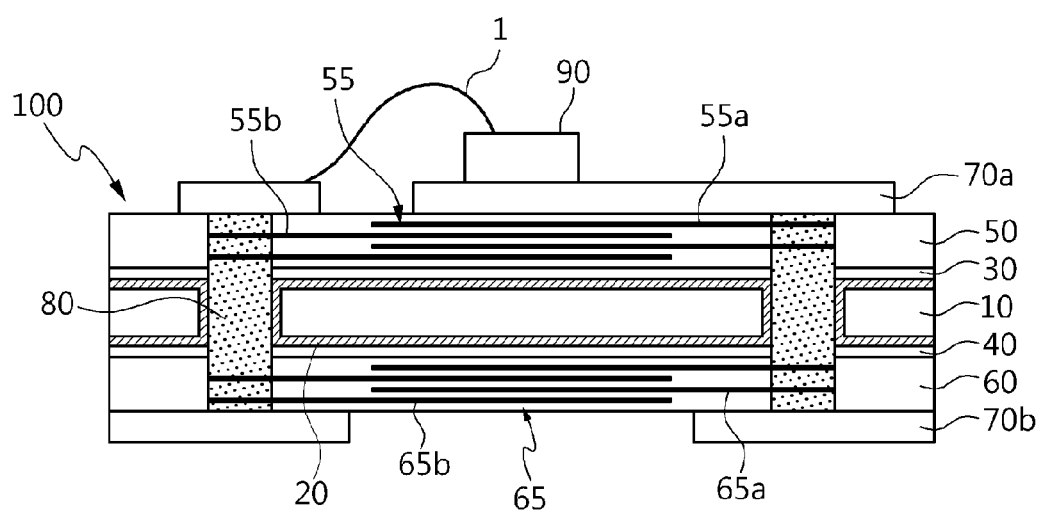
FIG. 1 is a side cross-sectional view illustrating a non-shrink varistor substrate according to the present invention.
Figure 2:
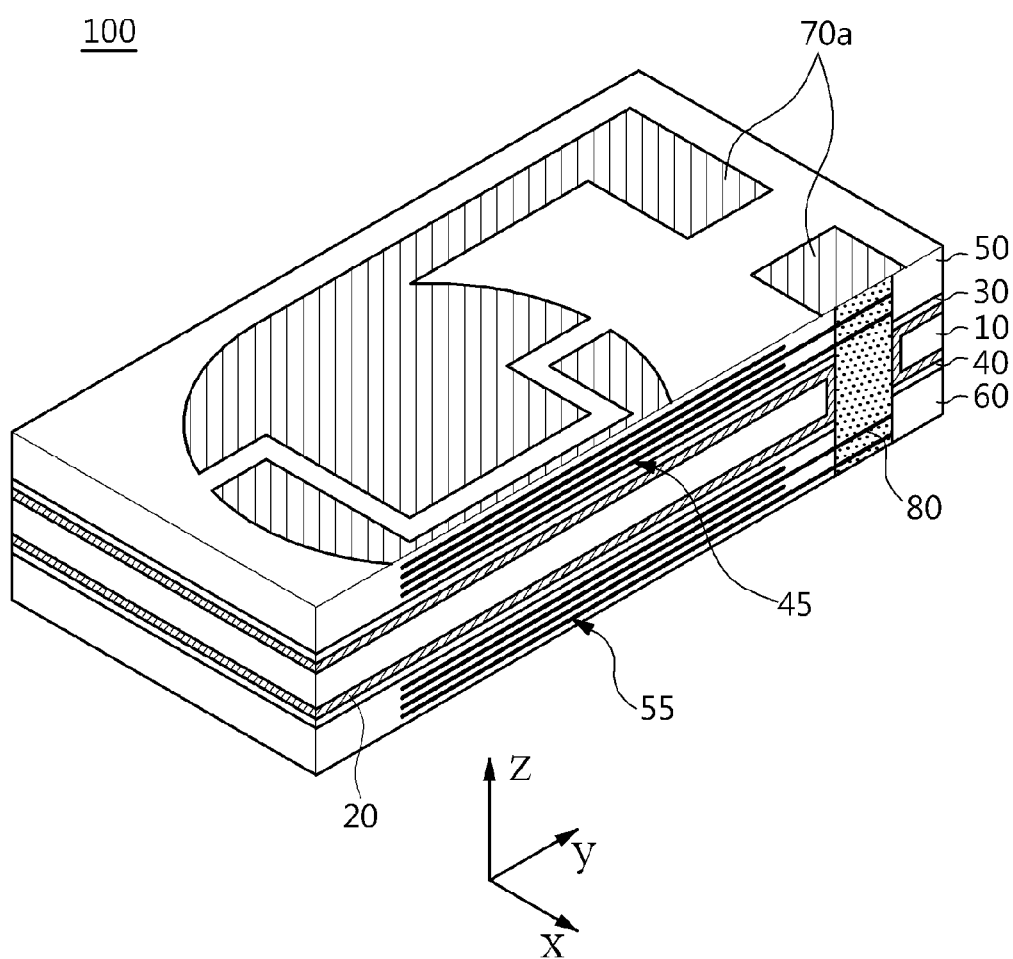
FIG. 2 is a perspective cross-sectional view illustrating the non-shrink varistor substrate according to the present invention.
Figure 3:
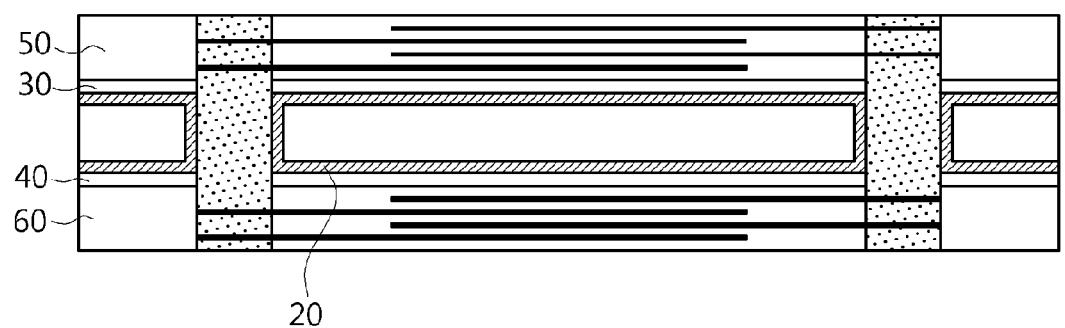
FIG. 3 is a view illustrating a reinforcement layer and a thin bonding layer in the non-shrink varistor substrate according to the present invention.

As illustrated in FIGS. 1 to 3, a non-shrink varistor substrate 100 according to the present invention includes a reinforcement layer 10, a thin bonding layer 20, a first bonding layer 30, a second bonding layer 40, a first varistor layer 50, a second varistor layer 60, outer electrode layers 70a, and 70b.

The reinforcement layer 10 may include at least one of $Al_2O_3$, AlN and MgO. Such a reinforcement layer 10 may be provided in sheet form. The reinforcement layer 10 may have at least one via hole at one side thereof The thin bonding layer 20 is formed on the surface of the reinforcement layer 10 made of a post-fired ceramic material. A material for the thin bonding layer 20 may include at least one of $SiO_2$, CuO and $Cr_2O_3$. In the present invention, the thin bonding layer 20 is formed, after which pre-firing may be performed to result in an oxide layer, or may not be implemented depending on the type of layer material. When the thin bonding layer 20 is provided in this way, the bondability between the reinforcement layer 10 made of a post-fired ceramic material and the varistor layers 50, 60 is enhanced upon firing a varistor molded body. Also, the non-shrink varistor substrate 100 according to the present invention is configured such that the varistor layers 50, 60 are bonded to the reinforcement layer 10 including the thin bonding layer 20 formed on the surface thereof, thus achieving precise dimensions at a shrinkage rate of 0~0.9%.

The first bonding layer 30 and the second bonding layer 40 are formed on and under the reinforcement layer 10, respectively. Also, the first bonding layer 30 and the second bonding layer 40 may have at least one via hole at a position corresponding to the position of the via hole of the reinforcement layer 10. The first bonding layer 30 and the second bonding layer 40 may be formed using at least one of ZnO, $Pr_2O_5$, $Bi_2O_3$ and $Sb_2O_3$. The first bonding layer 30 and the second bonding layer 40 are formed so as to enhance the bondability between the reinforcement layer 10 and the first varistor layer 50 and between the reinforcement layer 10 and the second varistor layer 60. In order to maximize bondability, the first bonding layer 30 and the second bonding layer 40 may be composed of 75~95 parts by weight of ZnO, and 5~15 parts by weight of $Bi_2O_3$. Also, the first bonding layer 30 and the second bonding layer 40 may further include 0~5 parts by weight of $Pr_2O_5$, and 0~5 parts by weight of $Sb_2O_3$. The first bonding layer 30 and the second bonding layer 40 may be formed so that a firing temperature is about 900° C. Moreover, the non-shrink varistor substrate 100 according to the present invention may be configured such that the thin bonding layer 20 is formed on the surface of the reinforcement layer 10, without the first bonding layer 30 and the second bonding layer 40, and thereby the varistor layers 50, 60 may be bonded on and under the thin bonding layer 20.

The first varistor layer 50 is formed on the first bonding layer 30. The second varistor layer 60 is formed under the second bonding layer 40. The first varistor layer 50 and the second varistor layer 60 are a varistor having an antistatic function. The name varistor is a portmanteau of variable resistor. Such a varistor indicates a non-linear semiconductor resistor the resistance of which varies depending on the applied voltage. When the applied voltage is equal to or higher than a predetermined level, the varistor plays a role in protecting the device by discharging electricity. The first varistor layer 50 and the second varistor layer 60 may be provided in the form of a ZnO-based substrate having good thermal conductivity and reflectivity.

The first varistor layer 50 and the second varistor layer 60 may be provided in a structure where a plurality of green sheets is stacked. As such, the plurality of green sheets may be manufactured as below. Specifically, a ZnO powder is mixed with an additive, such as $Bi_2O_3$ or $Sb_2O_3$, and at least one of $Co_3O_4$, $Nd_2O_3$ and $Pr_6O_{11}$ so as to possess a desired composition. The ZnO powder thus obtained is subjected to ball milling for 24 hr together with a solvent such as water or alcohol, thus preparing a feed powder. The feed powder is mixed with, as an additive, about 6 wt % of a PVB binder that is weighed per the amount of the feed powder and dissolved in a toluene/alcohol-based solvent. The resulting mixture is milled for about 24 hr using a small ball mill and blended, thus preparing a slurry. This slurry may be formed into a plurality of green sheets having a desired size using a process such as doctor blading or the like.

Some of the green sheets of each of the first varistor layer 50 and the second varistor layer 60 may be printed with a first inner electrode layer 55 and a second inner electrode layer 65. The others of the green sheets of each of the first varistor layer 50 and the second varistor layer 60 may not be printed with the first inner electrode layer 55 and the second inner electrode layer 65. The first inner electrode layer 55 includes a first sub inner electrode layer 55a electrically connected to a first pole, and a second sub inner electrode layer 55b electrically connected to a second pole having a polarity opposite the first pole. The second inner electrode layer 65 includes a first sub inner electrode layer 65a electrically connected to a first pole, and a second sub inner electrode layer 65b electrically connected to a second pole having a polarity opposite the first pole. The first inner electrode layer 55 and the second inner electrode layer 65 may be formed of Ag or AgPd. Also, each of the first inner electrode layer 55 and the second inner electrode layer 65 may have at least one via hole at a position corresponding to the position of the via hole of the reinforcement layer 10. The first varistor layer 50 and the second varistor layer 60 may be formed so that a firing temperature is about 1000~1100° C. Below, a molded body including the reinforcement layer 10, the first bonding layer 30, the second bonding layer 40, the first varistor layer 50 and the second varistor layer 60 is referred to as a varistor molded body.

When the varistor molded body is fired, the first bonding layer 30 and the second bonding layer 40 are rapidly fired, compared to the first varistor layer 50 and the second varistor layer 60, and simultaneously, bondability between the reinforcement layer 10 and the first varistor layer 50 and between the reinforcement layer 10 and the second varistor layer 60 may be enhanced. Furthermore, the non-shrink varistor substrate 100 according to the present invention may include only the first varistor layer 50 provided on the thin bonding layer 20 or on the first bonding layer under the condition that the first bonding layer 30 is present, without the second varistor layer 60.

The outer electrode layers 70a, 70b are formed on the first varistor layer 50 and under the second varistor layer 60, respectively, and are electrically connected to the inner electrode layers 55, 65 by a conductive material 80 loaded in the via hole formed through the first varistor layer 50, the thin bonding layer 20, the reinforcement layer 10, and the second varistor layer 60.

The light emitting device 90 may be mounted on one pole of the outer electrode layer 70a, 70b. Such a light emitting device 90 is electrically connected to the outer electrode layer having a different pole by means of a wire 1. Below is a description of a method of manufacturing a non-shrink varistor substrate according to embodiments of the present invention.

Figure 4:
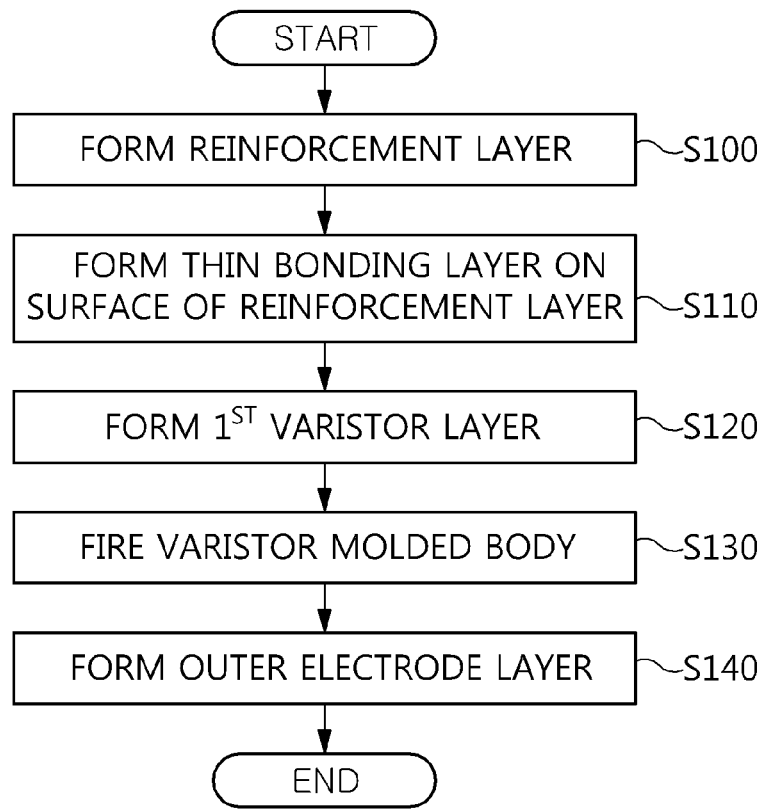
FIG. 4 is a flowchart illustrating a process of manufacturing a non-shrink varistor substrate according to an embodiment of the present invention.

As illustrated in FIG. 4, a method of manufacturing a non-shrink varistor substrate according to an embodiment of the present invention includes forming a reinforcement layer using a post-fired ceramic material (S100). The reinforcement layer may be formed of at least one of $Al_2O_3$, AlN and MgO. The reinforcement layer may be provided in sheet form. The reinforcement layer may have at least one via hole at one side thereof.

Then, forming a thin bonding layer on the surface of the reinforcement layer (S110) is carried out. The thin bonding layer is formed on the surface of the reinforcement layer made of a post-fired ceramic material. In the present invention, the thin bonding layer may be formed of at least one of $SiO_2$, CuO, $TiO_2$ and $Cr_2O_3$. Furthermore, the formed thin film layer may be pre-fired to give an oxide layer, but pre-firing may not be implemented depending on the type of layer material.

Then, forming a first varistor layer having a plurality of inner electrode layers therein on the thin bonding layer (S120) is carried out. The first varistor layer is a varistor having an antistatic function. The first varistor layer may be provided in the form of a ZnO-based substrate having good thermal conductivity and reflectivity. The first varistor layer may be provided in a structure where a plurality of green sheets is stacked. As such, the plurality of green sheets may be manufactured as below. Specifically, a ZnO powder is mixed with an additive, such as $Bi_2O_3$ or $Sb_2O_3$, and at least one of $Co_3O_4$, $Nd_2O_3$ and $Pr_6O_{11}$ so as to have a desired composition. The ZnO powder thus obtained is subjected to ball milling for 24 hr using a solvent such as water or alcohol, thus preparing a feed powder. The feed powder is mixed with, as an additive, about 6 wt % of a PVB binder that is weighed per the amount of the feed powder and dissolved in a toluene/alcohol-based solvent. The resulting mixture is milled for about 24 hr using a small ball mill and blended, thus preparing a slurry. Such a slurry may be formed into a plurality of green sheets having a desired size using a process such as doctor blading or the like.

Some of the green sheets of the first varistor layer may be printed with a first inner electrode layer. The others of the green sheets of the first varistor layer may not be printed with the first inner electrode layer. The first inner electrode layer includes a first sub inner electrode layer electrically connected to a first pole, and a second sub inner electrode layer electrically connected to a second pole having a polarity opposite the first pole. The first inner electrode layer may be formed of Ag or AgPd. Also, the first inner electrode layer may have at least one via hole at a position corresponding to the position of the via hole of the reinforcement layer.

Then, firing a molded body including the reinforcement layer, the thin bonding layer and the first varistor layer (S130) is carried out. Below the molded body including the reinforcement layer, the thin bonding layer and the first varistor layer is called a varistor molded body.

Then, forming an outer electrode layer provided on the first varistor layer and electrically connected to the inner electrode layers by a conductive material loaded in the via hole formed through the first varistor layer, the thin bonding layer and the reinforcement layer (S140) is carried out. The outer electrode layer is formed on the first varistor layer, and is electrically connected to the inner electrode layers by the conductive material loaded in the via hole formed through the first varistor layer, the thin bonding layer, and the reinforcement layer.

Figure 5:
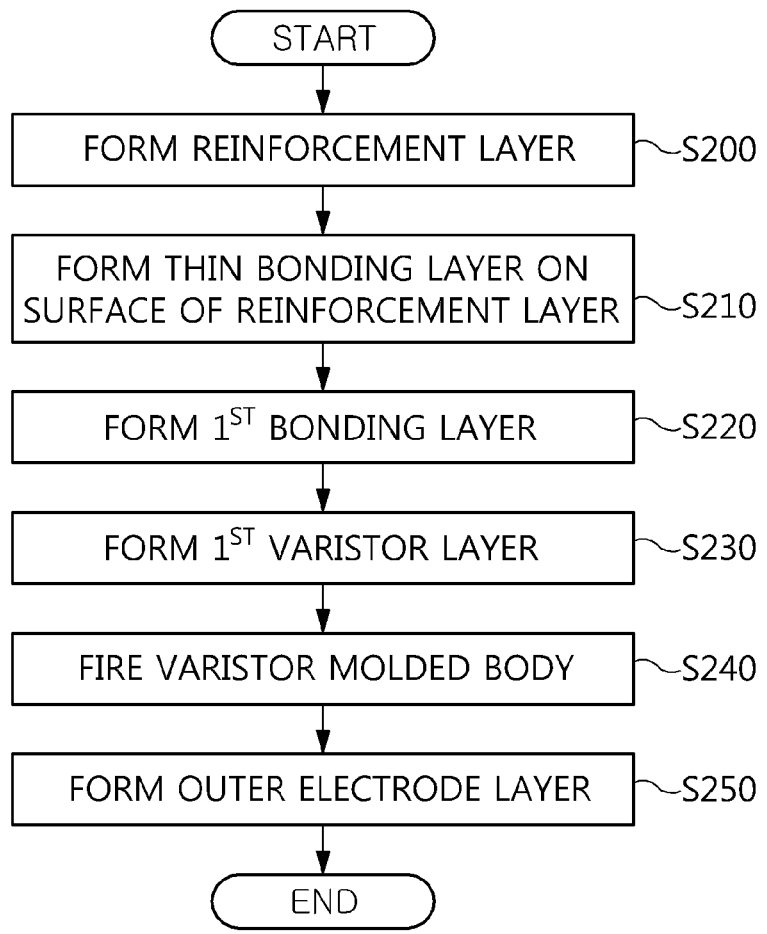
FIG. 5 is a flowchart illustrating a process of manufacturing a non-shrink varistor substrate according to another embodiment of the present invention.

As illustrated in FIG. 5, a method of manufacturing a non-shrink varistor substrate according to another embodiment of the present invention includes forming a reinforcement layer (S200), forming a thin bonding layer on the surface of the reinforcement layer (S210), and forming a first bonding layer on the thin bonding layer (S220). When the first bonding layer is formed in this way, bondability between the thin bonding layer and the first varistor layer may be further enhanced. Also, firing a varistor molded body (S230) is carried out under the condition that the first bonding layer is provided. Upon forming an outer electrode layer (S240), the outer electrode layer is formed on the first varistor layer, and is electrically connected to the inner electrode layers by a conductive material loaded in the via hole formed through the first varistor layer, the thin bonding layer, and the reinforcement layer.

Figure 6:
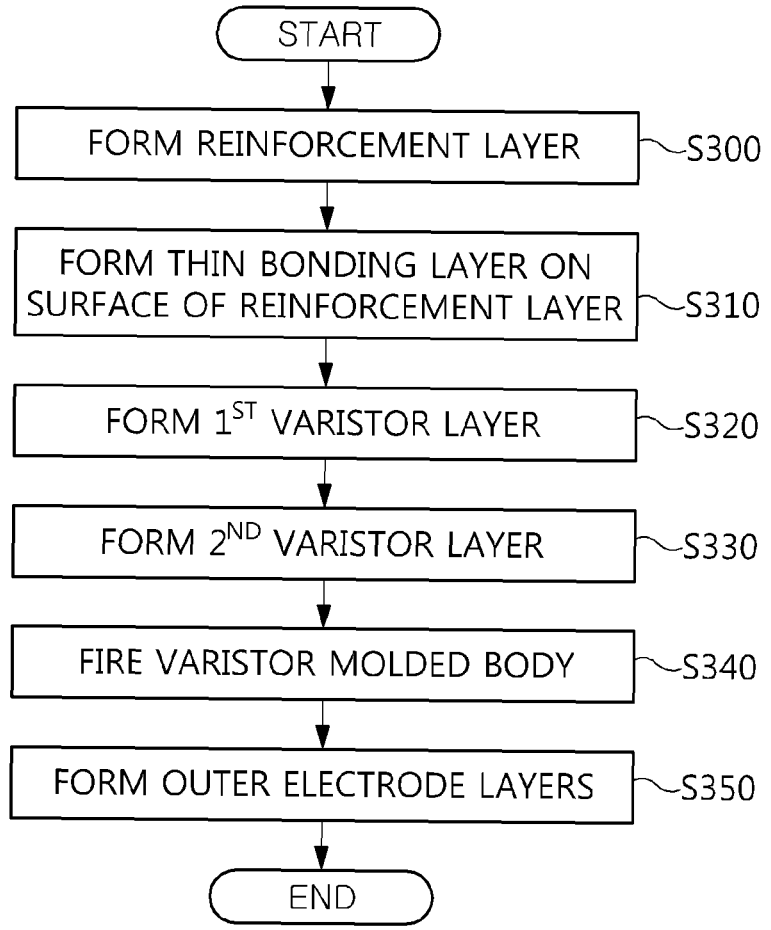
FIG. 6 is a flowchart illustrating a process of manufacturing a non-shrink varistor substrate according to still another embodiment of the present invention.

As illustrated in FIG. 6, a method of manufacturing a non-shrink varistor substrate according to still another embodiment of the present invention includes forming a reinforcement layer (S300), forming a thin bonding layer on the surface of the reinforcement layer (S310), forming a first varistor layer on the thin bonding layer (S320), and forming a second varistor layer under the thin bonding layer (S330). The second varistor layer is formed under the thin bonding layer and includes a plurality of inner electrode layers therein, as in the first varistor layer. The second varistor layer is a varistor having an antistatic function. The second varistor layer may be provided in the form of a ZnO-based substrate having good thermal conductivity and reflectivity. The second varistor layer 40 may be formed in a structure where a plurality of green sheets is stacked. As such, the plurality of green sheets may be manufactured as below. Specifically, a ZnO powder may be mixed with an additive, such as $Bi_2O_3$ or $Sb_2O_3$, and at least one of $Co_3O_4$, $Nd_2O_3$ and $Pr_6O_{11}$ so as to have a desired composition. The ZnO powder thus obtained is subjected to ball milling for 24 hr together with a solvent such as water or alcohol, thus preparing a feed powder. The feed powder is mixed with, as an additive, about 6 wt % of a PVB binder that is weighed per the amount of the feed powder and dissolved in a toluene/alcohol-based solvent. The resulting mixture is milled for about 24 hr using a small ball mill and blended, thus preparing a slurry. Such a slurry may be formed into a plurality of green sheets having a desired size using a process such as doctor blading or the like.

Some of the green sheets of the second varistor layer may be printed with a second inner electrode layer. The others of the green sheets of the second varistor layer may not be printed with the second inner electrode layer. The second inner electrode layer includes a first sub inner electrode layer electrically connected to a first pole and a second sub inner electrode layer electrically connected to a second pole having a polarity opposite the first pole. The first inner electrode layer may be formed of Ag or AgPd. Also, the first inner electrode layer may have at least one via hole at a position corresponding to the position of the via hole of the reinforcement layer.

Also, firing a varistor molded body (S340) is performed under the condition that the second varistor layer is provided. Then, upon forming outer electrode layers (S350), the outer electrode layers are provided on the first varistor layer and under the second varistor layer, and are electrically connected to the inner electrode layers by a conductive material loaded in a via hole formed through the first varistor layer, the thin bonding layer, the reinforcement layer, and the second varistor layer. As such, before forming the first varistor layer, a first bonding layer may be further formed on the thin bonding layer, and before forming the second varistor layer, a second bonding layer may be further formed under the thin bonding layer.

As described hereinbefore, although the preferred embodiments of the present invention regarding the non-shrink varistor substrate and the method of manufacturing the same have been disclosed for illustrative purposes, those skilled in the art will appreciate that various modifications, additions and substitutions are possible, without departing from the scope and spirit of the invention as disclosed in the accompanying claims.

The invention claimed is:

1. A non-shrink varistor substrate, comprising:
   a reinforcement layer formed of a ceramic material;
   a thin bonding layer formed on a surface of the reinforcement layer;
   a first varistor layer formed on the thin bonding layer and including a plurality of inner electrode layers; and
   an outer electrode layer formed on the first varistor layer and electrically connected to the inner electrode layers by a conductive material loaded in a via hole formed through the first varistor layer, the thin bonding layer, and the reinforcement layer.

2. The non-shrink varistor substrate of claim 1, further comprising a first bonding layer formed between the thin bonding layer and the first varistor layer.

3. The non-shrink varistor substrate of claim 2, wherein the first bonding layer has a ZnO-based composition comprising, based on 100 parts by weight thereof, 75~95 parts by weight of ZnO, 0~5 parts by weight of $Pr_2O_5$, 5~15 parts by weight of $Bi_2O_3$, and 0~5 parts by weight of $Sb_2O_3$.

4. The non-shrink varistor substrate of claim 1, further comprising a second varistor layer formed under the thin bonding layer and including a plurality of inner electrode layers therein.

5. The non-shrink varistor substrate of claim 4, further comprising a second bonding layer formed between the thin bonding layer and the second varistor layer and having a via hole filled with a conductive material at one side thereof.

6. The non-shrink varistor substrate of claim 1, wherein the thin bonding layer comprises an oxide layer.

7. The non-shrink varistor substrate of claim 1, wherein the reinforcement layer comprises at least one of $Al_2O_3$, AlN and MgO, and
   the first varistor layer comprises a ZnO-based substrate.

8. The non-shrink varistor substrate of claim 1, wherein the thin bonding layer comprises at least one of $SiO_2$, CuO, $TiO_2$ and $Cr_2O_3$.

9. A method of manufacturing a non-shrink varistor substrate, comprising:
   forming a reinforcement layer using a ceramic material;
   forming a thin bonding layer on a surface of the reinforcement layer;
   forming a first varistor layer having a plurality of inner electrode layers on the thin bonding layer;
   firing a varistor molded body comprising the reinforcement layer, the thin bonding layer, and the first varistor layer; and
   forming an outer electrode layer provided on the first varistor layer and electrically connected to the inner electrode layers by a conductive material loaded in a via hole formed through the first varistor layer, the thin bonding layer, and the reinforcement layer.

10. The method of claim 9, further comprising forming a first bonding layer on the thin bonding layer, after forming the thin bonding layer, and
    firing the varistor molded body is performed under a condition that the first bonding layer is provided.

11. The method of claim 10, wherein the first bonding layer has a ZnO-based composition comprising, based on 100 parts by weight thereof, 75~95 parts by weight of ZnO, 0~5 parts by weight of $Pr_2O_5$, 5~15 parts by weight of $Bi_2O_3$, and 0~5 parts by weight of $Sb_2O_3$.

12. The method of claim 10, wherein the reinforcement layer comprises at least one of $Al_2O_3$, AlN and MgO, and the first varistor layer comprises a ZnO-based substrate.

13. The method of claim 9, further comprising forming a second varistor layer having a plurality of inner electrode layers therein under the thin bonding layer, after forming the first varistor layer, and firing the varistor molded body is performed under a condition that the second varistor layer is provided.

14. The method of claim 13, further comprising forming a second bonding layer under the thin bonding layer, before forming the second varistor layer, and firing the varistor molded body is performed under a condition that the second bonding layer is provided.

15. The method of claim 9, wherein forming the thin bonding layer comprises forming the thin bonding layer into an oxide layer.

16. The method of claim 9, wherein the thin bonding layer comprises at least one of $SiO_2$, $CuO$, $TiO_2$ and $Cr_2O_3$.

17. A light emitting diode (LED) package, comprising the non-shrink varistor substrate of claim 1.

18. A non-shrink varistor substrate, comprising:
a ceramic reinforcement layer having at least one via hole;
a first varistor layer being stacked on the ceramic reinforcement layer and having a plurality of inner electrode layers and at least one via hole at a position corresponding to the position of the via hole of the ceramic reinforcement layer;
an outer electrode layer formed on the first varistor layer;
a second outer electrode layer formed on a second varistor layer, wherein the second varistor layer has a same structure of the first varistor layer, and both are formed symmetrically across the ceramic reinforcement layer;
a thin bonding layer formed on a surface of the reinforcement layer;
a first bonding layer formed between the thin bonding layer and the first varistor layer;
a second bonding layer formed between the thin bonding layer and the second varistor layer; and
a conductive material loaded in the via holes in order to connect the outer electrode layer and the inner electrode layer electrically.

* * * * *